United States Patent
Sugita et al.

(10) Patent No.: US 11,324,151 B2
(45) Date of Patent: May 3, 2022

(54) MEASUREMENT POSITION DETERMINATION DEVICE

(71) Applicant: FUJI CORPORATION, Chiryu (JP)

(72) Inventors: Hiroyoshi Sugita, Kariya (JP); Jun Iisaka, Nisshin (JP); Hidetoshi Kawai, Anjo (JP); Yusuke Yamakage, Anjo (JP)

(73) Assignee: FUJI CORPORATION, Chiryu (JP)

( * ) Notice: Subject to any disclaimer, the term of this patent is extended or adjusted under 35 U.S.C. 154(b) by 15 days.

(21) Appl. No.: 16/614,636

(22) PCT Filed: May 24, 2017

(86) PCT No.: PCT/JP2017/019348
§ 371 (c)(1),
(2) Date: Nov. 18, 2019

(87) PCT Pub. No.: WO2018/216132
PCT Pub. Date: Nov. 29, 2018

(65) Prior Publication Data
US 2020/0154620 A1    May 14, 2020

(51) Int. Cl.
| H05K 13/08 | (2006.01) |
| H05K 13/04 | (2006.01) |
| H05K 13/00 | (2006.01) |

(52) U.S. Cl.
CPC ..... *H05K 13/0812* (2018.08); *H05K 13/0069* (2013.01); *H05K 13/0413* (2013.01)

(58) Field of Classification Search
CPC ........... H05K 13/0812; H05K 13/0069; H05K 13/0413; H05K 13/0815; H05K 13/08
See application file for complete search history.

(56) References Cited

U.S. PATENT DOCUMENTS

| 5,329,359 A | 7/1994 | Tachikawa |
| 5,780,866 A * | 7/1998 | Yamamura ........... G01B 11/026 |
| | | 250/201.4 |

(Continued)

FOREIGN PATENT DOCUMENTS

| JP | 5-133724 A | 5/1993 |
| JP | 2006-203020 A | 8/2006 |

(Continued)

OTHER PUBLICATIONS

International Search Report dated Aug. 15, 2017 in PCT/JP2017/019348 filed May 24, 2017.

*Primary Examiner* — Peter Dungba Vo
*Assistant Examiner* — Jose K Abraham
(74) *Attorney, Agent, or Firm* — Oblon, McClelland, Maier & Neustadt, L.L.P.

(57) ABSTRACT

The measurement position determination device of the present disclosure is a measurement position determination device for determining a measurement position on a board, the measurement position being for measuring height of the board on which on which a component is mounted, and includes a measurement position determination section for acquiring one or more scheduled mounting positions of the component on the board at the time of measuring the board height and determining at least one of the acquired scheduled mounting positions as the measurement position of the board height.

3 Claims, 6 Drawing Sheets

(56) References Cited

U.S. PATENT DOCUMENTS

| | | | |
|---|---|---|---|
| 7,224,829 B2* | 5/2007 | Enokido | B23K 20/004 |
| | | | 382/145 |
| 2010/0071195 A1 | 3/2010 | Kihara et al. | |
| 2012/0317804 A1* | 12/2012 | Endo | H05K 13/083 |
| | | | 29/832 |
| 2014/0141539 A1* | 5/2014 | Shinji | G01N 21/95684 |
| | | | 438/7 |
| 2014/0160272 A1* | 6/2014 | Shinji | G01N 21/95607 |
| | | | 348/87 |
| 2016/0183419 A1* | 6/2016 | Fujita | H05K 13/0404 |
| | | | 29/739 |
| 2016/0209207 A1* | 7/2016 | Kim | H05K 13/0815 |

FOREIGN PATENT DOCUMENTS

| | | | | |
|---|---|---|---|---|
| JP | 2011-233738 A | 11/2011 | | |
| JP | 2016219526 A * | 12/2016 | | |
| JP | 6155322 B2 * | 6/2017 | ....... | H01L 21/67288 |
| WO | WO 2012/056617 A1 | 5/2012 | | |
| WO | WO-2012056617 A1 * | 5/2012 | ......... | H05K 13/0812 |
| WO | WO 2014/033856 A1 | 3/2014 | | |
| WO | WO-2014033856 A1 * | 3/2014 | ........ | G01B 11/0608 |
| WO | WO-2014207807 A1 * | 12/2014 | ........ | H05K 13/0417 |

\* cited by examiner

MEASUREMENT POSITION DETERMINATION DEVICE

TECHNICAL FIELD

The present disclosure relates to a measurement position determination device.

BACKGROUND ART

Conventionally, a component mounting machine for measuring the height of a board when a component is mounted on a board has been known. For example, a component mounting machine described in Patent Literature 1 measures the heights of nine measurement points set in a grid pattern on a board and derives a correctional value for the height of a working point on the board based on the measurement values.

PATENT LITERATURE

Patent Literature 1: JP-A1-2014/033856

BRIEF SUMMARY

Technical Problem

However, in the case of measuring nine points in a grid pattern on a predetermined board as disclosed in Patent Literature 1, with a component being already mounted at a measurement point, the height of the component may introduce an error, thereby preventing the height of the board from being measured correctly.

The present disclosure has been made in order to solve the above-mentioned problem, and a main object thereof is to determine a measurement position at which a board height can be measured with high accuracy.

Solution to Problem

The present disclosure employs the following means in order to achieve the main object described above.

The measurement position determination device of the present disclosure is a measurement position determination device for determining a measurement position on a board, the measurement position being for measuring height of the board on which a component is mounted, and the measurement position determination device includes a measurement position determination section for acquiring one or more scheduled mounting positions of the component on the board at the time of measuring the board height and determining at least one of the acquired scheduled mounting positions as the measurement position of the board height.

The measurement position determination device determines at least one of the scheduled mounting positions of the component on the board at the time of measuring the board height as a measurement position of the board height. As a result, erroneous measurement of the board height with a component already mounted at the measurement position may be unlikely to occur, when the device for measuring board heights (e.g., a component mounting machine) measures the board height, which enables the device for measuring the board height to measure the board height with high accuracy. As described above, the measurement position determination device of the present disclosure determines a measurement position at which the board height can be measured accurately.

DESCRIPTION OF EMBODIMENTS

Figure 1:
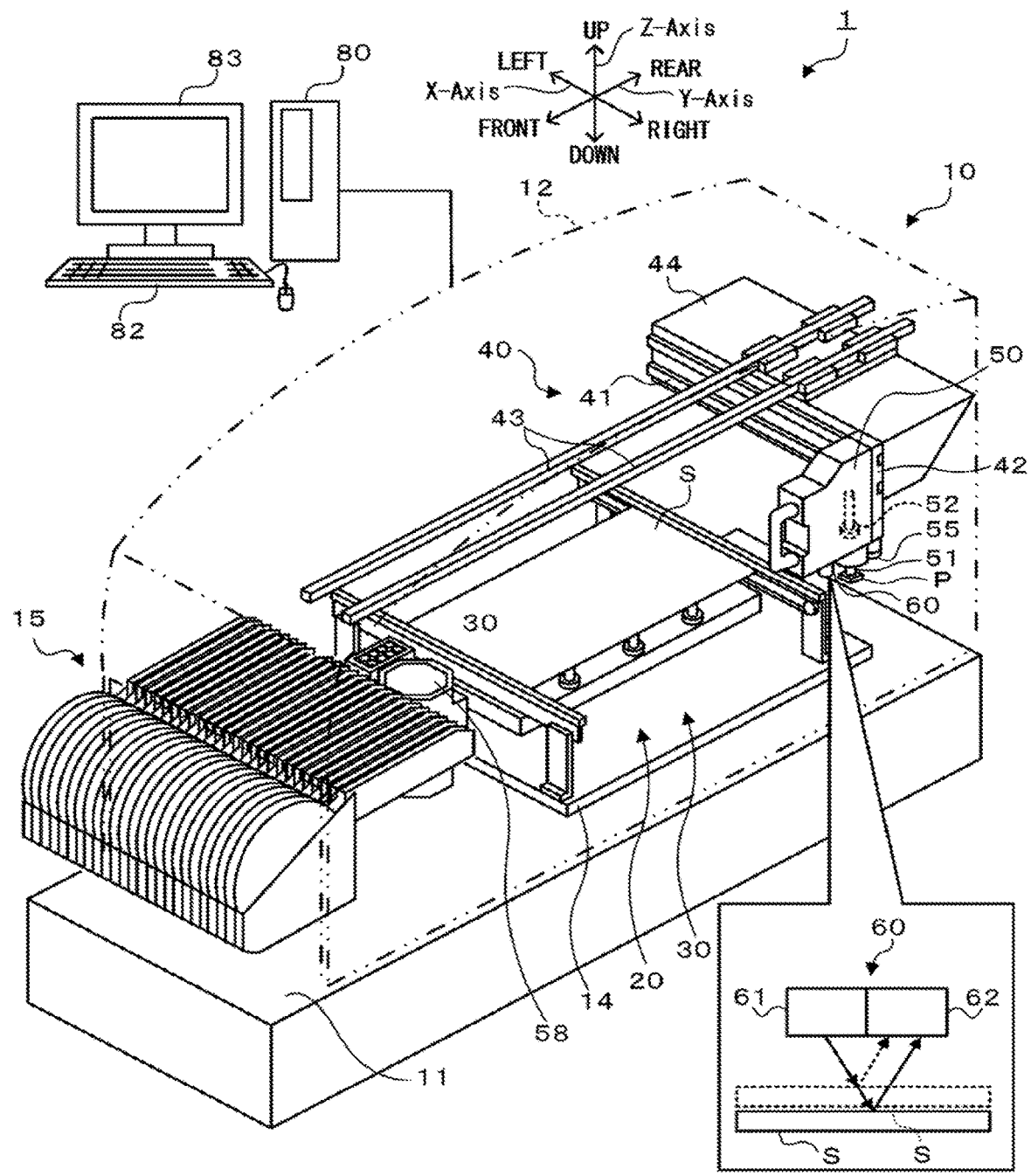
FIG. 1 A diagram showing a configuration of mounting system 1 including component mounting machine 10.
Figure 2:
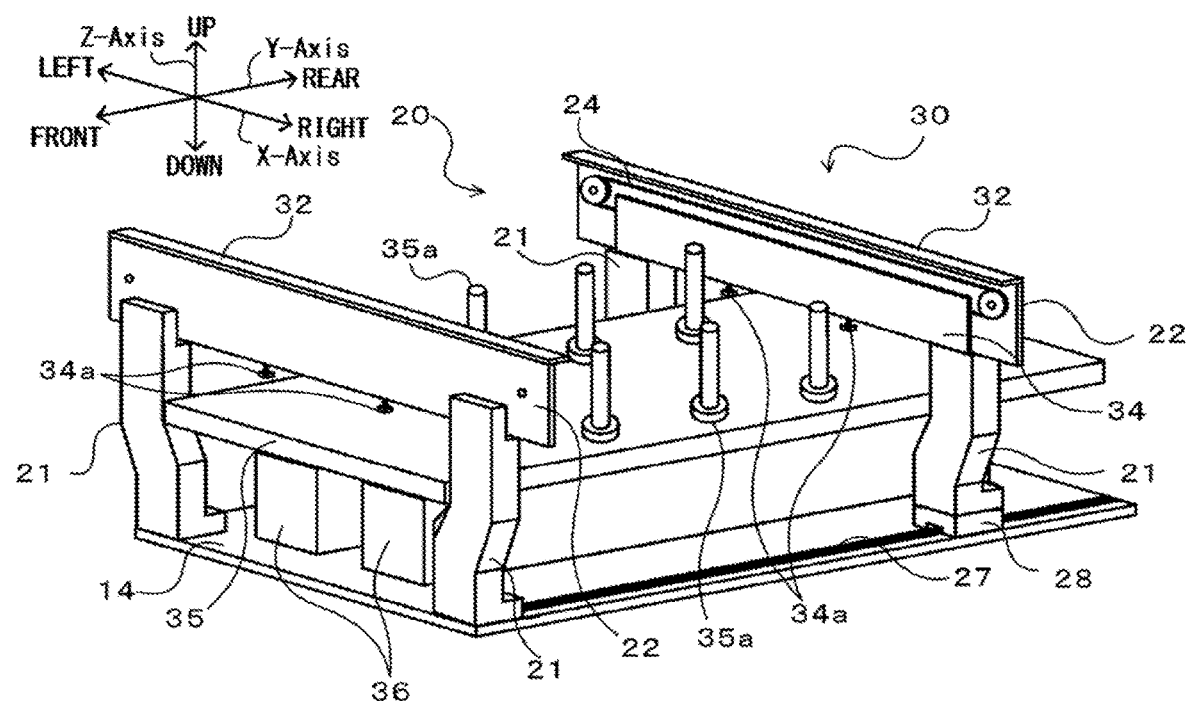
FIG. 2 A schematic configurational diagram of board conveyance device 20 and board holding device 30.
Figure 3A:
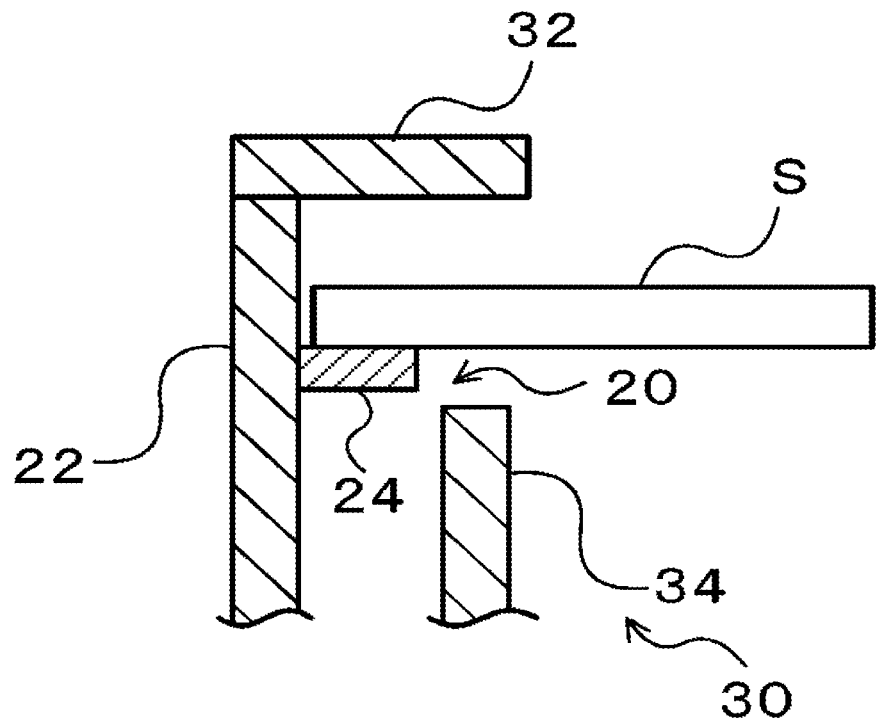
FIG. 3 A diagram showing a state in which board holding device 30 holds board S.
Figure 3B:
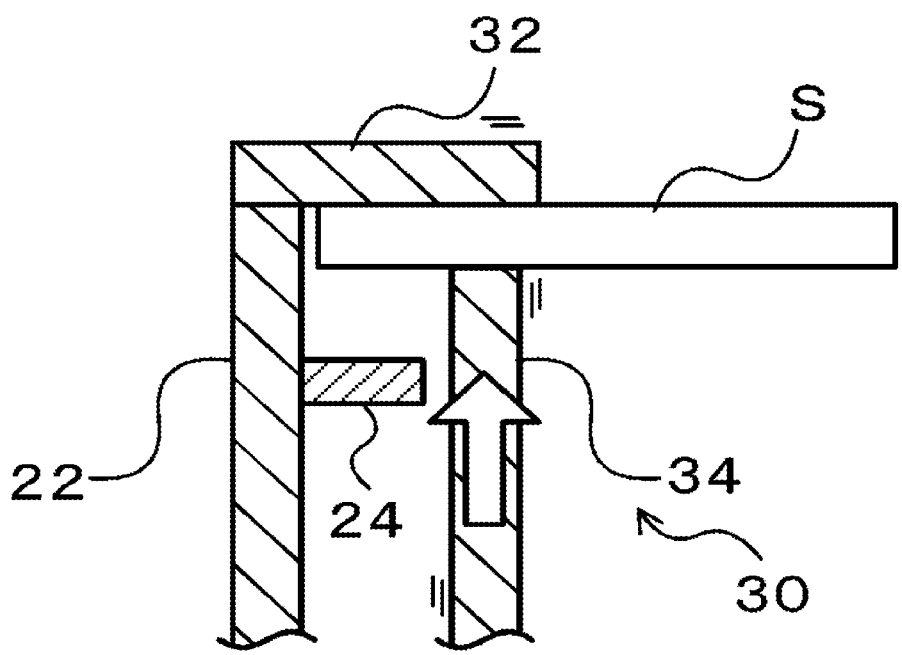
Figure 4:
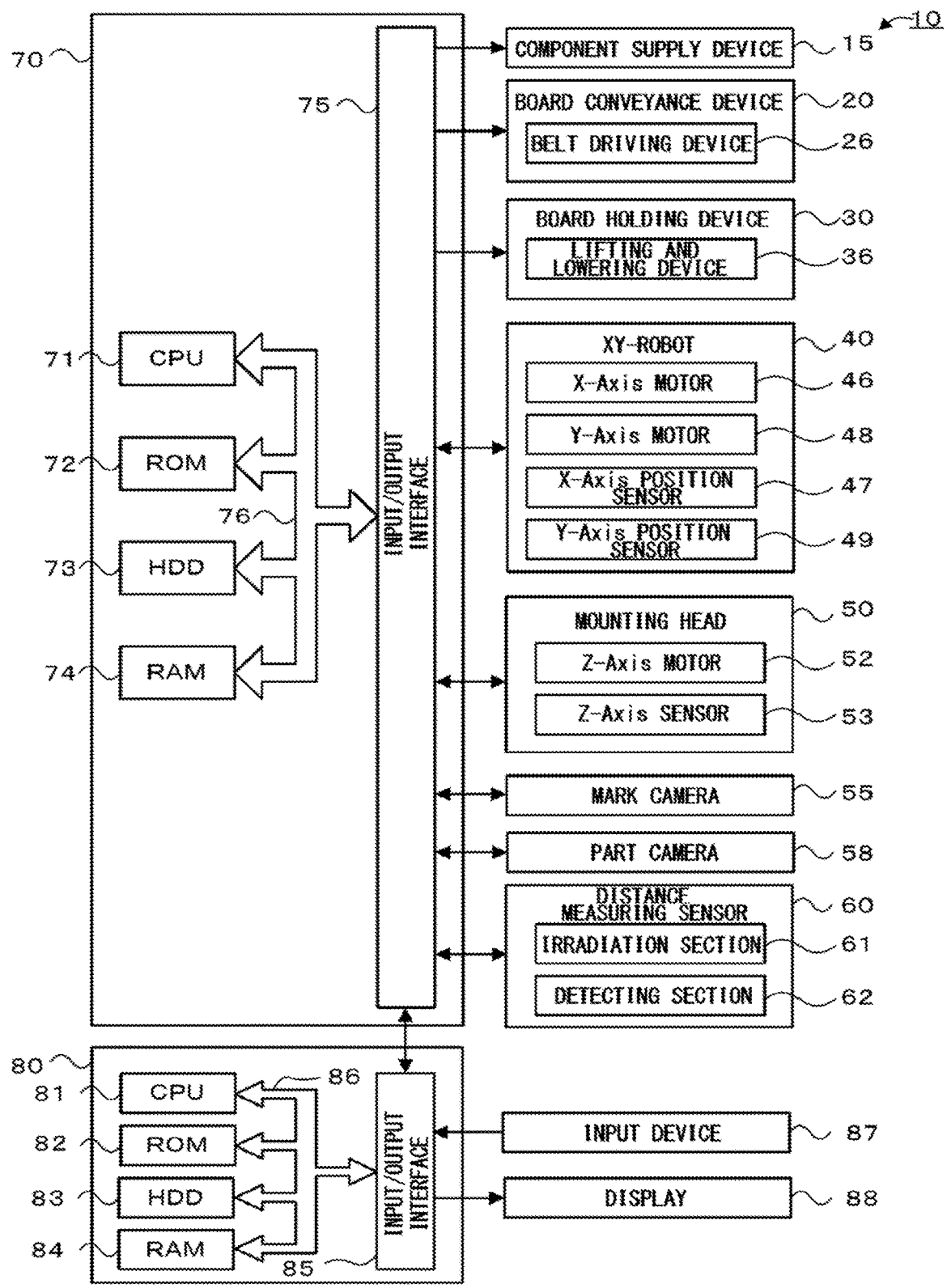
FIG. 4 A diagram showing electrical connections of control device 70.

Embodiments of the component mounting machine of the present disclosure will be described below with reference to the drawings. FIG. 1 is a configurational diagram schematically showing a configuration of mounting system 1 including component mounting machine 10 of the present embodiment, FIG. 2 is a schematic configurational diagram of board conveyance device 20 and board holding device 30, FIG. 3 is a diagram showing a state in which board holding device 30 holds board S, and FIG. 4 is a diagram showing electrical connections of control device 70. FIG. 3A shows a state in which board holding device 30 does not hold board S, and FIG. 3B shows a state in which board holding device 30 holds board S. In the present embodiment, the up-down direction (Z-axis direction), the left-right direction (X-axis direction), and the front-rear direction (Y-axis direction) are as shown in FIGS. 1 and 2.

As shown in FIG. 1, mounting system 1 includes component mounting machine 10 and management device 80 which manages component mounting machine 10. In mounting system 1, multiple component mounting machines 10 for mounting components P on board S are arranged along the conveyance direction (X-axis direction) of board S. In FIG. 1, only one component mounting machine 10 is shown for convenience of explanation. Mounting system 1 may include a solder printing machine, an inspection machine, a reflow furnace, or the like on the same mounting line as component mounting machine 10.

As shown in FIG. 1, component mounting machine 10 includes base 11, housing 12, component supply device 15, board conveyance device 20, board holding device 30, XY-robot 40, mounting head 50, mark camera 55, part camera 58, distance measuring sensor 60, and control device 70 (refer to FIG. 4). Component supply device 15 is detachably disposed with respect to base 11. Board conveyance device 20 and board holding device 30 are disposed on support table 14 disposed on base 11.

Component supply device 15 is a device for supplying components P to the component supply position and is configured as a tape feeder in the present embodiment. Component supply device 15 supplies components P to the component supply position by pulling out, from a reel, a tape in which components P are accommodated in accommodation sections formed at predetermined intervals, and feeding the tape at a pitch.

Board conveyance device 20 is a device that conveys board S from upstream to downstream (for example, from left to right). As shown in FIG. 2, board conveyance device 20 is configured as a belt conveyor device that conveys board S with belt conveyor 24. Board conveyance device 20 includes a pair of side frames 22 arranged at predetermined intervals in the Y-axis direction, conveyor belt 24 provided on each of the pair of side frames 22, and belt driving device 26 (refer to FIG. 4) for driving conveyor belt 24 to rotate. Board S is conveyed in the X-axis direction by belt driving device 26 rotating conveyor belt 24 while placed on conveyor belt 24. Each of the pair of side frames 22 is supported by two support columns 21 arranged in the X-axis direction. Slider 28 is attached to the lower end of each of the two support columns 21 which support one of the pair of side frames 22 (i.e., rear side frame 22). Slider 28 is configured to be movable on guide rail 27 provided on support table 14 along the Y-axis direction. Therefore, by moving the two support columns 21 with slider 28 and adjusting the distance between the pair of side frames 22 in the Y-axis direction, boards S of different sizes can be conveyed.

Board holding device 30 is a device for holding board S arranged on conveyor belt 24, and is configured as a clamping device for clamping and holding board S in the present embodiment. Board holding device 30 includes a pair of board presser plates 32, a pair of clampers 34, supporting plate 35, and lifting and lowering device 36. The pair of board presser plates 32 are provided at the upper ends of the pair of side frames 22, respectively. The pair of clampers 34 are disposed below each of the pair of board presser plates 32. The lower end faces of the pair of clampers 34 are each provided with protruding sections 34a protruding downward. Supporting plate 35 is a plate-like member disposed below the pair of clampers 34. Supporting plate 35 is lifted and lowered by lifting and lowering device 36. When supporting plate 35 rises, the upper face of supporting plate 35 comes into contact with protruding section 34a of clamper 34 and pushes up clamper 34. Support plate 35 is provided with multiple support pins 35a (six in this embodiment) for supporting the lower face of board S when board S is clamped. Lifting and lowering device 36 is disposed between support table 14 and supporting plate 35, and lifts and lowers the pair of clampers 34 via supporting plate 35. When lifting and lowering device 36 raises the pair of clampers 34 while board S is placed on conveyor belt 24 (FIG. 3A), board S is pushed up by the pair of clampers 34 and pressed against the lower face of board presser plate 32 (FIG. 3B). As a result, board holding device 30 holds board S by clamping each of the front and rear edges of board S between two members (i.e., board presser plate 32 and clamper 34) from above and below.

XY-robot 40 is a device that moves mounting head 50, mark camera 55, and the distance measuring sensor 60 in the XY-direction. As shown in FIG. 1, XY-robot 40 includes a pair of left and right Y-axis guide rails 43 provided along the front-rear direction (Y-axis direction), and Y-axis slider 44 spanning the pair of left and right Y-axis guide rails 43 and movable along Y-axis guide rails 43 in the Y-axis direction. XY-robot 40 includes X-axis guide rails 41 provided on the side face of Y-axis slider 44 along the left-right direction (X-axis direction) and X-axis slider 42 movable along X-axis guide rail 41 in the X-axis direction. X-axis slider 42 is movable by driving of X-axis motor 46 (see FIG. 4), and Y-axis slider 44 is movable by driving of Y-axis motor 48 (see FIG. 4). Mounting head 50 is attached to X-axis slider 42, and mounting head 50 moves in the XY-direction as a result of XY-robot 40 (the X-axis motor 46 and the Y-axis motor 48) being drive controlled by control device 70. XY-robot 40 includes X-axis position sensor 47 (refer to FIG. 4), for detecting the position of X-axis slider 42 in the X-axis direction, and Y-axis position sensor 49 (see FIG. 4), for detecting the position of Y-axis slider 44 in the Y-axis direction.

Mounting head 50 is a device for mounting components P supplied from component supply device 15 on board S with suction nozzle 51. Mounting head 50 is detachably mounted on X-axis slider 42 and moves in the XY-direction through the action of XY-robot 40. Mounting head 50 includes suction nozzle 51, Z-axis motor 52, and Z-axis position sensor 53 (refer to FIG. 4). Suction nozzle 51 is detachably mounted on the lower face of mounting head 50. In the present embodiment, one suction nozzle 51 is attached to mounting head 50, but multiple suction nozzles 51 may be attached. Suction nozzle 51 is a pickup member for picking up component P using negative pressure. Z-axis motor 52 is a mechanism for lifting and lowering suction nozzle 51 along the Z-axis, thereby adjusting the height of suction nozzle 51 and component P picked up by suction nozzle 51. Z-axis position sensor 53 detects the position of suction nozzles 51 in the Z-axis direction. In addition, mounting head 50 includes a rotating device for rotating (rotating) suction nozzle 51 by a driving motor (not shown) so that the angle of component P held (sucked) by suction nozzle 51 can be adjusted.

Mark camera 55 is a device for imaging a reference mark (not shown) on board S from above. Mark camera 55 is disposed on the lower face of mounting head 50 and moves in the XY-direction along with of mounting head 50.

Part camera 58 is disposed in front of board conveyance device 20. The imaging range of part camera 58 is above part camera 58. When suction nozzle 51 sucking component P passes above part camera 58, part camera 58 images component P sucked by suction nozzle 51 from below.

Distance measuring sensor 60 is a device for measuring the height of board S (i.e., the position in the Z-axis direction). The board height is the height of the upper face of board S. Distance measuring sensor 60 is disposed on the lower face of mounting head 50, and moves in the XY-direction along with mounting head 50. Distance measuring sensor 60 is comprised of a laser height sensor in the present embodiment, as shown in the blow-up of FIG. 1, irradiation section 61 for irradiating laser light downward, and detecting section 62 for receiving the laser light after being reflected by board S. When irradiation section 61 irradiates the laser light obliquely downward toward board S disposed below, the laser light is reflected by the upper face of board S and the reflected laser light enters detecting section 62. In this configuration, as shown by the solid line and the broken line in the blow-up of FIG. 1, the optical path of the reflected light (shown by the arrow) changes in accordance with the position of the upper face of board S. Detecting section 62 measures the board height based on the distance detected by detecting the distance between distance measuring sensor 60 and the upper face of board S in the Z-axis direction, this distance being based on the difference in the incident position of the laser beam that results from differences in the optical path. The board height may be the distance between distance measuring sensor 60 and the upper face of board S in the Z-axis direction or may be a value based on a predetermined height derived from this distance.

Control device 70 is a device for controlling all of component mounting machine 10. As shown in FIG. 4, control device 70 includes CPU 71, ROM 72, HDD 73, RAM 74, and input/output interface 75. These are electrically connected via bus 76. Detection signals from X-axis position sensor 47 and Y-axis position sensor 49, detection signals from Z-axis position sensor 53, image signals from mark camera 55 and part camera 58, detection signals from distance measuring sensor 60, and the like are inputted to control device 70 via input/output interface 75. Control device 70 outputs a control signal to component supply device 15, a control signal to board conveyance device 20 and board holding device 30, a drive signal to XY-robot 40 (X-axis motor 46 and Y-axis motor 48), a drive signal to mounting head 50, a drive signal to mark camera 55 and part camera 58, a drive signal to distance measurement sensor 60, and the like via input/output interface 75. Further, control device 70 is connected to management device 80 so as to be capable of communicating in a bidirectional manner, and exchanges data and control signals with each other.

Management device 80 is a device that manages all of mounting system 1. As shown in FIG. 4, management device 80 includes CPU 81, ROM 82, HDD 83, RAM 84, and input/output interface 85. These are electrically connected via bus 86. Management device 80 includes input device 87, such as a keyboard and a mouse, and display 88, such as an LCD. An input signal from input device 87 is inputted to management device 80 via input/output interface 85. An image signal to display 88 is outputted from management device 80 via input/output interface 85. Management device 80 transmits and receives information to and from control device 70 of component mounting machine 10 via input/output interface 85. HDD 83 of management device 80 stores programs for producing board S. The production program of board S includes, for each of multiple component mounting machines 10 in mounting system 1, information about which component P is to be mounted at which position of which board S and in which order, and information on how many boards S so mounted are to be produced, and the like. The production program also includes information regarding the height (thickness) of component P.

Figure 5:
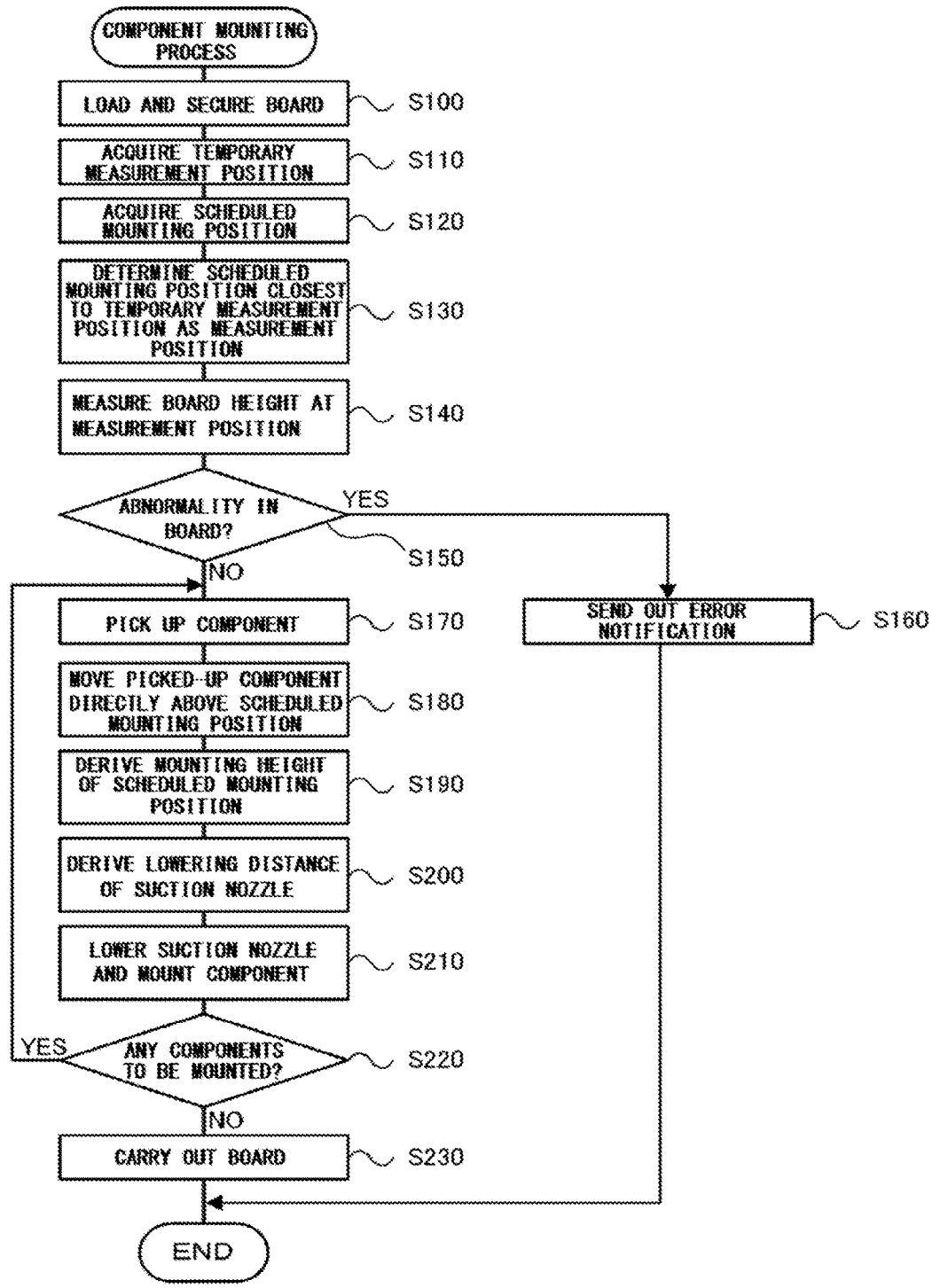
FIG. 5 A flow chart showing an example of a component mounting process routine.
Figure 6:
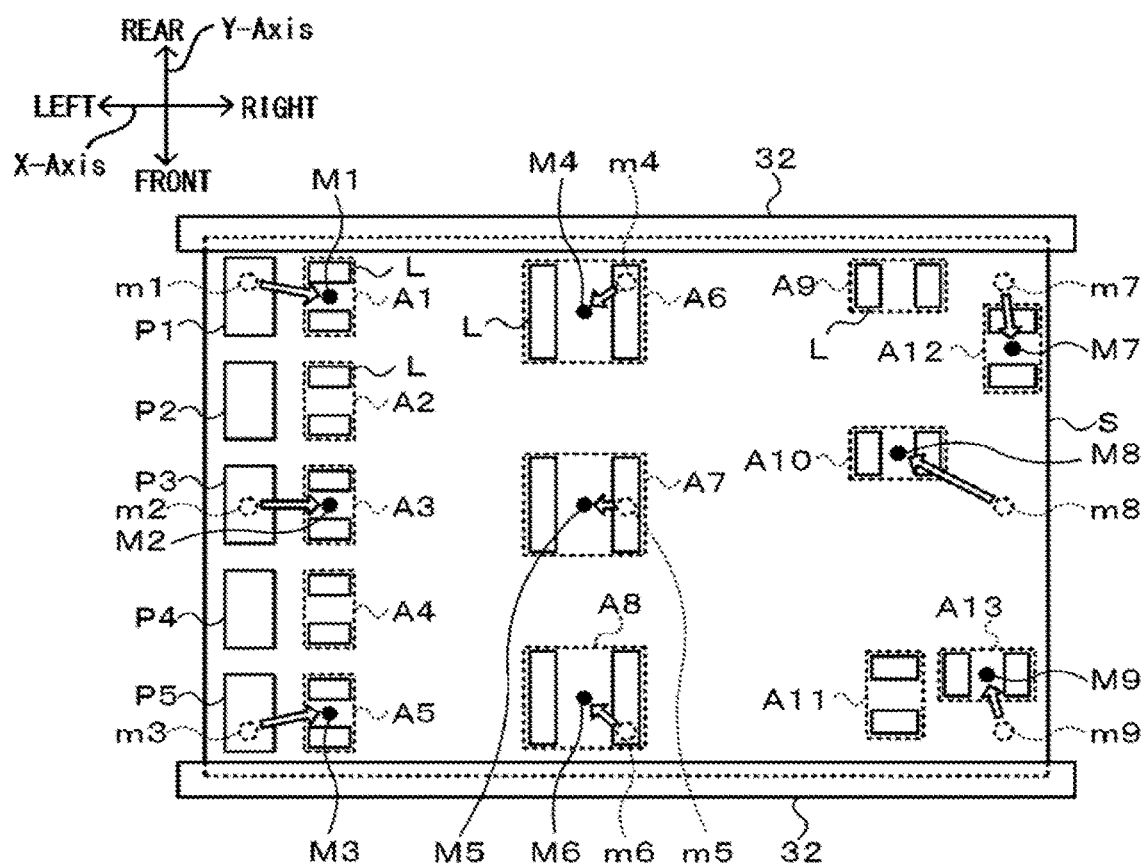
FIG. 6 A diagram showing a state in which measurement positions M1 to M9 are determined.

Next, the operation of component mounting machine 10 of the present embodiment configured as described above, in particular, the process of mounting component P on board S together with measuring the board height will be described. FIG. 5 is a flow chart showing an example of the component mounting process executed by CPU 71 of control device 70. FIG. 6 is a diagram showing a state in which measurement positions M1 to M9 of the board height are determined. The component mounting process routine is stored in, for example, HDD 73. The component mounting process is executed by CPU 71 when a command is received from management device 80, for example.

When the component mounting process is started, CPU 71 first causes board conveyance device 20 to load board S, and then causes board holding device 30 to clamp and fix loaded board S (step S100). FIG. 6 shows an example of the upper face of board S in a clamped state. As shown in FIG. 6, components P are already on board S with having been mounted on board S by component mounting machine 10 (other device) upstream of component mounting machine 10 (current device) clamping board S. Further, multiple lands L, which will be described later in detail, are already on board S. Although not shown, solder printed on multiple lands L by a solder printing machine upstream from the current device, for example, is also present on board S. Through lands L and the solder printed on lands L, components P and the conductor patterns on board S connect to each other.

Subsequently, CPU 71 acquires one or more temporary measurement positions m for measuring the board height of board S (step S110). Temporary measurement positions m are preset by the operator, for example, and stored in HDD 83 of management device 80, and CPU 71 acquires temporary measurement positions m from management device 80. Temporary measurement positions are indicated by, for example, XY-coordinates in reference to the position of a reference mark (not shown) attached to board S. In the present embodiment, CPU 71 acquires multiple temporary measurement positions m, specifically temporary measurement positions m1 to m9, as shown in FIG. 6. Temporary measurement positions m1 to m9 are arranged on board S in a grid pattern such that three points are arranged along the X-axis direction and three points are arranged along the Y-axis direction. In addition, among temporary measurement positions m1 to m9, positions other than temporary measurement position m5 positioned at the center are determined so as to be arranged at positions close to the outer edge of board S, and temporary measurement positions m1 to m9 are set to be positions apart from each other as much as possible.

Next, CPU 71 acquires one or more scheduled mounting positions of component P on board S (step S120). Scheduled mounting positions are mounting positions of component P to be mounted on board S by component mounting machine 10 (current device), and are included in the above-described production program. In step S120, CPU 71 acquires the scheduled mounting positions from management device 80. The scheduled mounting positions are indicated by, for example, XY-coordinates with reference to the position of a reference mark (not shown) attached to board S. In the present embodiment, the scheduled mounting positions are the center positions of each component P mounted on board S. In FIG. 6, scheduled mounting areas A1 to A13, which are areas where components P are scheduled to be mounted, are indicated with broken line boxes. Coordinates of the centers of each of the scheduled mounting areas A1 to A13 in the XY-direction are scheduled mounting positions. Scheduled mounting areas A1 to A13 are collectively referred to as scheduled mounting areas A. Lands L shown in FIG. 6 are conductor patterns for attaching components P, to be mounted on mounting areas A1 to A13, to board S and are arranged to coincide with scheduled mounting areas A1 to A13, respectively. In the example of FIG. 6, lands L are arranged either in two places in the vicinity of both left and right edges, or in two places in the vicinity of both front and rear edges, of each of scheduled mounting areas A1 to A13.

When temporary measurement positions m (here, temporary measurement positions m1 to m9) and the scheduled mounting positions are acquired, CPU 71 determines at least one of the scheduled mounting positions acquired in step S120 as measurement position M of the board height (step S130). In the present embodiment, CPU 71 determines measurement position M of the board height based on acquired temporary measurement position m and the scheduled mounting position. More specifically, CPU 71 determines, for each of acquired temporary measurement positions m, the scheduled mounting position closest to temporary measurement position m as measurement position M. For example, as shown in FIG. 6, CPU 71 determines the center position of scheduled mounting area A1 as measurement position M1, in which scheduled mounting area A1 is the scheduled mounting position closest to temporary measurement position m1 among the scheduled mounting positions (i.e., center positions of each of scheduled mounting areas A1 to A13) acquired in step S120. Similarly, CPU 71 determines the center positions of each of scheduled mounting areas A3, A5 to A8, A12, A10, and A13, which are the nearest mounting scheduled positions to each of temporary measurement positions m2 to m9, as measurement positions M2 to M9 (refer to FIG. 6).

CPU 71 then causes distance measuring sensor 60 to measure the board height of board S at each of determined measurement positions M (here, measurement positions M1 to M9) (step S140). In step S140, CPU 71 first moves mark camera 55 above board S to image board S and detects the position of the reference mark on board S based on the obtained image. CPU 71 then controls XY-robot 40 based on the detected position of the reference mark so that distance measuring sensor 60 moves above measurement position M1 determined in step S130 and causes distance measuring sensor 60 to measure the board height of board S. CPU 71 measures the board heights at each of measurement positions M2 to M9 by using XY-robot 40 and distance measuring sensor 60 in the same manner. CPU 71 then associates each of measured positions M1 to M9 with the measured board heights and stores the board heights in RAM 74.

In this manner, CPU 71 measures the board height at measurement positions M located at the scheduled mounting positions rather than at temporary measurement positions m. For this reason, for example, in FIG. 6, although components P1, P3, P5 which have already been mounted are at the positions of temporary measurement positions m1 to m3, CPU 71 can measure the board height at positions where the mounted components P are not present (i.e., measurement positions M1 to M3) with avoiding these components. Therefore, for example, if the board height is directly measured at temporary measurement positions m1 to m3, the height (thickness) of components P1, P3, P5 will introduce an error, but by measuring the board height at measurement positions M1 to M3, such an error does not occur and the board height can be measured with high accuracy. The scheduled mounting position is a center position of component P mounted on board S (here, a center position of scheduled mounting area A). As shown in FIG. 6, in many cases, there is no land L at the center position of component P mounted on board S. Therefore, by setting the center position at which component P is to be mounted as measurement position M, the thickness of solder on land L does not introduce error to the board height. For example, in FIG. 6, land L and the solder (not shown) on land L are at temporary measurement positions m4 to m6, but CPU 71 can measure the board height at positions (measurement positions M4 to M6) where lands L are avoided.

Instead of CPU 71 determining measurement positions M, it is also conceivable that the operator determines, in advance, measurement positions M at positions which avoid pre-mounted components P and lands L on board S. However, in this case, if the type, number, and position of components P mounted on board S are different, it is necessary to determine measurement positions M of board S for each pattern and therefore a burden is imposed on the operator. In component mounting machine 10 of the present embodiment, since CPU 71 determines measurement positions M, the burden on the operator is reduced.

When the board heights are measured at measurement positions M, CPU 71 determines whether board S is abnormal based on the measured board heights (step S150). In the present embodiment, CPU 71 determines whether there is an unacceptable warp in board S as an abnormality in board S. For example, CPU 71 determines that there are no abnormalities in board S when all of the multiple measured board heights (here, nine) fall within a predetermined normal range. On the other hand, when one or more of the multiple board heights deviates from the predetermined normal range, CPU 71 determines that board S has an unacceptable warp and is abnormal. CPU 71 may determine whether there is an unacceptable warp in board S based on whether the difference between the maximum value and the minimum value of the multiple measured board heights exceed a predetermined threshold. As described above, since component mounting machine 10 of the present embodiment can accurately measure the board height, CPU 71 can also accurately determine the presence of abnormalities in board S. If it is determined in step S150 that there is an abnormality in board S, CPU 71 sends out an error notification (step S160) and ends the present routine. For example, CPU 71 may display error information on a display (not shown) provided in component mounting machine 10 or may output the error information to management device 80 as an error notification. When the error notification is sent out, the operator checks the abnormality of board S and discards board S, for example.

If it is determined in step S150 that there is no abnormality in board S, CPU 71 causes suction nozzle 51 to pick up component P to be mounted next based on the production program (step S170). CPU 71 moves mounting head 50 above the component supply position of component supply device 15, moves suction nozzle 51 downward by the driving of Z-axis motor 52, and sucks component P to the leading end (lower end) of suction nozzle 51. CPU 71 moves mounting head 50 so that picked-up component P is positioned directly above the scheduled mounting position of board S (step S180). Note that CPU 71 may control XY-robot 40 so that suction nozzle 51 passes over part camera 58 during step S180 and image component P picked up by suction nozzle 51 with part camera 58. In this case, CPU 71 may process the captured image to determine the presence or absence of an abnormal suction of component P, or may perform a process of adjusting the orientation of component P by rotating suction nozzles 51 with a driving motor (not shown).

CPU 71 then derives the mounting height of picked-up component P (step S190). The mounting height is, for example, the board height of the scheduled mounting position of component P. CPU 71 derives the mounting height based on the board height at measurement position M measured in step S140. When the scheduled mounting position of picked-up component P is the same as any of measurement positions M, CPU 71 takes the board height measured at measurement position M as the mounting height. Otherwise, CPU 71 derives the shape of the top face of board S based on the board height measured in step S140 by approximate calculations using known techniques and derives the mounting height based on the derived shape. For example, CPU 71 determines three measurement positions M, among multiple measurement positions M, with forming the smallest triangle surrounding the scheduled mounting position of picked-up component P. CPU 71 then derives, based on the board heights at the three points, the mounting height at the mounting position of picked-up component P where the surface shape of board S in the triangular area surrounded by the determined three points is regarded as a plane passing through the three points. When triangles surrounding a scheduled mounting position cannot be drawn only with measurement positions M, such as when the scheduled mounting position of picked-up component P is located near the outer edge of board S, for example, CPU 71 may derive the mounting height based on the board heights at both the front and rear edges of board S. Since both front and rear ends of board S are clamped by board holding device 30, and the board height of the clamped portion is always the same value, i.e., a known value, CPU 71 can also adopt these values to derive the mounting height. Alternatively, CPU 71 may also derive the board height of a virtual measurement position M other than measurement position M by a calculation based on the board height at measurement position M and derive the mounting height with adopting the derived board height. For example, based on the board height of each of two or more measurement positions M arranged on a straight line in the upper face view, a position other than measurement position M on the straight line may be set as a virtual measurement position M, and the board height at this position may be derived with a straight line approximation or a curve approximation. This makes it possible to virtually increase the number of measurement positions M. Also in the above-described step S150, CPU 71 may derive the board height of the virtual measurement position M in this manner, and determine the presence or absence of abnormalities in board S using the board heights of all measurement positions M including the virtual measurement position M.

After step S190, CPU 71 derives the lowering distance of suction nozzle 51 necessary at the time of mounting based on the derived mounting height and the thickness (height) of picked-up component P, being included in the production program, (step S200), and after lowering suction nozzle 51 by the derived lowering distance, CPU 71 releases the suction by suction nozzle 51 to mount component P on board S (step S210). As described above, since component mounting machine 10 of the present embodiment can measure the board height with high accuracy, CPU 71 can also derive the mounting height and the lowering distance with high accuracy. For this reason, in component mounting machine 10, it is possible to prevent problems at the time of mounting component P, such as component P separating from suction nozzle 51 before component P comes in contact with board S, or damages to board S or component P caused by nozzle 51 pressing component P excessively against board S. CPU 71 may perform the processes of step S190, S200 prior to step S210, and also in parallel with step S180, for example.

When component P is mounted, CPU 71 determines whether there is component P included in the production program yet to be mounted (step S220), and if there is an unmounted component P, performs the processes of step S170 and subsequent steps. That is, CPU 71 successively mounts components P to be mounted on board S. When there is no unmounted component P in step S220, that is, when mounting of all of components P to be mounted on board S is completed, CPU 71 carries out board S with board conveyance device 20 (step S230) and terminates the present routine. CPU 71 repeats the component mounting process routine of FIG. 5 in accordance with the number of boards S, included in the production program, to be produced.

Here, the correspondence relationship between the constituent elements of the present embodiment and the constituent elements of the present disclosure will be described. Mounting head 50 of the present embodiment corresponds to a mounting head of the present disclosure, distance measuring sensor 60 corresponds to a height measurement section, and control device 70 corresponds to a measurement position determination section and a control section. XY-robot 40 corresponds to a moving measurement section.

With component mounting machine 10 of the present embodiment described in detail above, CPU 71 of control device 70 acquires one or more scheduled mounting positions (here, center coordinates of scheduled mounting area A) of component P on board S at the time of measuring the board height, and determines at least one of the acquired scheduled mounting positions as measurement position M of the board height. As a result, erroneous measurement of the board height (here, component mounting machine 10 itself) with component P pre-mounted at measurement position M is unlikely to occur when a device for measuring board heights measures the board height, enabling the device that measures board height to measure the board height with high accuracy. As described above, component mounting machine 10 of the present embodiment can determine the measurement position at which the board height can be measured with high accuracy. In addition, since the scheduled mounting position is determined as measurement position M, the accuracy of the mounting height derived in step S190 is further improved for component P mounted at the scheduled mounting position determined as measurement position M (e.g., component P mounted in scheduled mounting areas A1, A3, A5 to A8, A12, A10, A13 in FIG. 6). For example, when all measurement positions M are positions other than the scheduled mounting positions, CPU 71 needs to derive the mounting height by using the above-described approximations for components P mounted in any of scheduled mounting areas A1 to A13. On the other hand, in component mounting machine 10 of the present embodiment, for example, in the case of FIG. 6, the mounting height can be derived without using an approximation for component P mounted in scheduled mounting areas A1, A3, A5 to A8, A12, A10, A13, thereby improving the accuracy of deriving the mounting height.

In addition, CPU 71 acquires the center position of component P on board S as the scheduled mounting position (i.e., the center position of scheduled mounting area A). Since the center positions of components P to be mounted on board S do not have lands L in many cases, it is possible to prevent an error in board height due to the thickness of solder on land L at the time measuring the board height. Therefore, component mounting machine 10 can determine a measurement position at which board height can be measured with higher accuracy.

Further, CPU 71 acquires one or more (9 in this case) temporary measurement positions m of the board height, and determines, for each of the acquired temporary measurement positions m, a scheduled mounting position as measurement position M, in which the scheduled mounting position is among the one or more acquired scheduled mounting positions and is closest to the provisional measurement position m. Therefore, it is possible to adjust measurement position M to the vicinity of temporary measurement position m while avoiding components P pre-mounted at the measurement position M at the time of measuring the board height. Therefore, for example, if the temporary measurement position m is set at a position suitable for measuring board height, the determined measurement position M is also likely to be a position suitable for measuring board height. For example, in the present embodiment, since temporary measurement positions m1 to m9 are set to be separated from each other as much as possible, measurement positions M1 to M9 are likely to be separated from each other as well. As a result, it is possible to prevent concentrating multiple measurement positions M in a single region of board S. When multiple measurement positions M are concentrated in a single region of board S, when CPU 71 derives the board height in a region other than the single region by computation, the error between the derived board height and the actual board height tends to be large. On the other hand, in component mounting machine 10 of the present embodiment, such a situation is unlikely to occur.

The present disclosure is not limited in any way to the above-mentioned embodiments, and it is needless to say that the present disclosure can be implemented in various forms as long as they fall within the technical scope of the present disclosure.

For example, in the component mounting process routine of the above-described embodiment, CPU 71 may acquire information on an exclusion region of board S to be excluded from measurement position M, and may determine a position other than the exclusion region as measurement position M in step S130. For example, CPU 71 may determine another scheduled mounting position as measurement position M by excluding the scheduled mounting position when the scheduled mounting position is included in the exclusion area, even if the scheduled mounting position is closest to temporary measurement position m. Examples of exclusion regions include one or more regions where components P pre-mounted on board S are present, a region where a character, such as a silk character, is printed, a land region where land L is present, a solder region where solder is present, and a region where there is a hole of board S. CPU 71 may acquire information of the exclusion region from HDD 73, for example, or may acquire the information of the exclusion area from management device 80. Further, CPU 71 may acquire information on the regions in which pre-mounted components P are present from other component mounting machines 10, or acquire information on the exclusion region from a device disposed upstream of the current device of mounting system 1, such as acquiring information from a solder printer if the exclusion region is a solder region with solder present. In this manner, CPU 71 acquires the information of the exclusion region as an area in which an error is likely to occur in the measurement of the board height, enabling determination of a measurement position at which the board height can be measured with higher accuracy. For example, when CPU 71 determines a position outside of the exclusion region as measurement position M, with component P being present inside the exclusion region, CPU 71 determines measurement position M by excluding a scheduled mounting position (scheduled mounting position of another component P to be mounted on pre-mounted component P) overlapping the position of pre-mounted component P. Therefore, it is possible to further prevent CPU 71 from determining a position, where component P has been already mounted, as measurement position M. Further, for example, by setting at least one of the land region and the solder region as the exclusion region and determining a position outside of the exclusion region as measurement position M with CPU 71, it is possible to further prevent the determination of the center position as measurement position M when solder is present at the center position of scheduled mounting region A in FIG. 6, for example.

In the embodiment described above, the center position of component P on board S (i.e., the center position of scheduled mounting area A) is set as the scheduled mounting position, but the present disclosure is not limited thereto. For example, a position other than the center position, such as an edge of scheduled mounting area A, may be set as the scheduled mounting position. In this case, a position among the scheduled mounting areas A closest to the temporary measurement position may be set as the scheduled mounting position. For example, when determining the measurement position corresponding to temporary measurement position m1 in FIG. 6, the position closest to temporary measurement position m1 may be determined as the measurement position in scheduled mounting area A1 closest to temporary measurement position m1.

In the embodiment described above, CPU 71 directly acquires the scheduled mounting positions from management device 80, but the present disclosure is not limited thereto. For example, CPU 71 may acquire position information of mounting scheduled areas A (e.g., the coordinates of the left front end and the coordinates of the right rear end of mounting scheduled area A) from management device 80, derive and acquire the mounting scheduled positions (e.g., derive the center position) based on the acquired position information.

In the embodiment described above, CPU 71 determines measurement position M corresponding to each of the temporary measurement positions m, but the present disclosure is not limited thereto, and for example, CPU 71 does not need to acquire temporary measurement positions m. Even in this case, with CPU 71 determining one or more measurement positions M on the basis of scheduled mounting positions, an advantage is obtained in which erroneous measurement of the board height due to the presence of component P pre-mounted at the measurement position is unlikely to occur. In this case, the number of measurement positions M to be determined may be predetermined.

In the embodiment described above, the number of temporary measurement positions m and the number of measurement positions M are nine, respectively, but the present disclosure is not limited thereto. For example, multiple temporary measurement positions m and one measurement position M may be used. When the number of measurement positions M is one, the known board height of the portion clamped to the board holding device 30 described above may be used to perform processes such as steps S150, S190, S200, and the like.

In the embodiment described above, the scheduled mounting positions acquired by CPU 71 in step S120 are the mounting positions of components P scheduled to be mounted on board S by component mounting machine 10 (current device), but the present disclosure is not limited thereto. For example, CPU 71 may also acquire the scheduled positions for mounting components P mounted by component mounting machine 10 downstream of the current device in step S120. However, if CPU 71 determines the scheduled mounting positions of components P to be mounted on the current device as measured positions M, such as by acquiring the scheduled mounting positions of components P to be mounted only on the current device, the number of components P, from which the mounting height can be derived, is more increased without using the approximations described above in step S190.

In the embodiment described above, board S may be a divided board (i.e., a multiple pattern board divided into multiple child boards). In this case, CPU 71 may acquire child board position information (e.g., the position of the dividing groove or the positions of two diagonal points of each rectangular child board) capable of specifying the region of each of the multiple child boards included in board S from, for example, management device 80, and determine the measurement position of the board height so that there is at least one measurement position for each of the multiple child boards. For example, CPU 71 may determine whether each of the acquired schedule mounting positions is included in any of the multiple child boards based on the child board position information, specify at least one scheduled mounting position present in each of the multiple child boards, and determine the specified multiple scheduled mounting positions as measurement positions. When determining a measurement position based on temporary measurement position m, CPU 71 may determine any one of a child board including temporary measurement position m or a schedule mounting position present in the same child board (e.g., the scheduled mounting position closest to temporary measurement position m in the child board) as a measurement position.

In the embodiment described above, CPU 71 may not only determine measurement position M based on temporary measurement position m as the measurement position, but may also add another predetermined measurement position. For example, in order to improve the accuracy of deriving the mounting height, a measurement position determined in advance by the operator as a position to be measured with a pinpoint may be stored in management device 80 or HDD 73, and CPU 71 may measure the board height in step S140 for both the measurement position determined in step S130 and the predetermined measurement position. As described above, the measurement position may include both a variable measurement position determined by CPU 71 based on the scheduled mounting position (e.g., measurement position M in FIG. 6) and a fixed measurement position determined independently of temporary measurement position m or the like.

In the embodiment described above, distance measuring sensor 60 is a laser height sensor using a laser beam, but the present disclosure is not limited to this, and any sensor may be used as long as the board height can be measured. For example, a contact type height sensor or an ultrasonic type height sensor may be used.

In the embodiment described above, XY-robot 40 moves mounting head 50 and distance measuring sensor 60 together, but the present disclosure is not limited thereto. For example, component mounting machine 10 may be provided with a head moving section for moving mounting head 50 and a moving measurement section for moving distance measuring sensor 60 separately.

In the embodiment described above, mounting head 50 picks up component P with suction nozzle 51 and mounts component P on board S, but the present disclosure is not limited thereto. For example, mounting head 50 may have a mechanical chuck that holds component P in place of suction nozzle 51.

In the embodiment described above, CPU 71 of component mounting machine 10 itself determines the measurement position, that is, component mounting machine 10 includes the measurement position determination device disclosed herein, but the present disclosure is not limited thereto. The measurement position may be determined by a device other than component mounting machine 10, for example, management device 80. For example, CPU 81 of management device 80 may perform steps S110 to S130 shown in FIG. 5 and output (transmit) the determined measured position to component mounting machine 10 via input/output interface 85. In this instance, for example, in step S120, based on the production program stored in HDD 83, CPU 81 acquires one or more scheduled mounting positions of components P to be mounted on board S at the time of measuring the board height of board S by component mounting machine 10 as a determination target of measurement positions (e.g., a state prior to the state in which component mounting machine 10 carries in board S and starts mounting component P). The scheduled mounting positions may be mounting positions of components P to be mounted on board S by component mounting machine 10 as the determination target of measurement positions, or may additionally include mounting positions of components P scheduled to be mounted by at least one component mounting machine 10 downstream of the component mounting machine 10 as the determination target of measurement positions. Even when CPU 81 of management device 80 determines the measurement positions, the board height can be measured with high accuracy by measuring the board height at the measurement position determined by component mounting machine 10, as in the above-described embodiment. When the management device 80 determines the measurement positions as described above, CPU 81 is equivalent to a measurement position determination section, and CPU 81 and input/output interfaces 85 are equivalent to an output section. For example, management device 80 may similarly perform steps S110 to S130 on each of multiple component mounting machines 10 included in mounting system 1 to determine the measurement positions at which each of component mounting machines 10 measures the board height. The above-described various modification examples of the present embodiment are also applicable to the case where management device 80 determines the measurement position.

The measurement position determination device and the component mounting machine of the present disclosure may be configured as follows.

In the measurement position determination device of the present disclosure, the measurement position determination section may acquire multiple scheduled mounting positions and determine at least two of the acquired scheduled mounting positions as measurement positions of board height.

In the measurement position determination device of the present disclosure, the measurement position determination section may acquire the center positions of the components on the board as scheduled mounting positions. Since the center positions of the components to be mounted on the board are often free of lands, it is possible to suppress errors from board height due to the thickness of solder present on the lands at the time of measuring the board height. Therefore, the measurement position determination device can determine measurement positions at which the board height can be measured with higher accuracy.

In the measurement position determination device of the present disclosure, the measurement position determination section may acquire one or more temporary measurement positions of board height, and may determine, for each of the acquired temporary measurement positions, a scheduled mounting position, which is closest to the temporary measurement position among the one or more acquired scheduled mounting positions, as the measurement position. In this way, it is possible to adjust the measurement position to the vicinity of the temporary measurement position while avoiding components pre-mounted at the measurement position at the time of measuring the board height. Therefore, for example, if the temporary measurement positions are set at positions suitable for measuring board height, the determined measurement position is also likely to be a position suitable for measuring board height. In this case, the measurement position determination section may acquire multiple temporary measurement positions.

In the measurement position determination device of the present disclosure, the measurement position determination section may acquire information on an exclusion region of the board to be excluded from the measurement position, and determine a position other than the exclusion region as the measurement position. The measurement position determination device can determine a measurement position where the board height can be measured more accurately by acquiring information of the exclusion region as a region in which an error is likely to occur when measuring the board height. The exclusion region may include, for example, one or more of a region in which a pre-mounted component is present, a region in which characters are printed, a land region, a solder region in which solder is present, and a region in which holes in the board are present.

The measurement position determination device of the present disclosure may include an output section for outputting the determined measurement positions to the device for measuring the board height.

The component mounting machine of the present disclosure may include the measurement position determination device of any of the above-mentioned embodiments, a mounting head for mounting a component on a board, a height measurement section for measuring the height of a board, and a control section for controlling the height measuring section so as to measure the heights of each of the board at each of the determined measurement positions. In this case, the component mounting machine of the present disclosure may include a moving measurement section that moves the height measurement section, and the control section may cause the moving measurement section and the height measurement section to measure the board height at each of the measurement positions.

INDUSTRIAL APPLICABILITY

The present disclosure can be applied to various industries in which operations to mount components on a board are performed.

REFERENCE SIGNS LIST

1 Mounting system, 10 Component mounting machine, 11 Base, 12 Housing, 14 Support table, 15 Component supply device, 20 Board conveyance device, 21 Support column, 22 Side frame, 24 Conveyor belt, 26 Belt driving device, 27 Guide rail, 28 Slider, 30 Board holding device, 32 Board presser plate, 34 Clamper, 34*a* Protruding section, 35 Supporting plate, 35*a* Support pin, 36 Lifting and lowering device, 40 XY-robot, 41 X-axis guide rail, 42 X-axis slider, 43 Y-axis guide rail, 44 Y-axis slider, 46 X-axis motor, 47 X-axis position sensor, 48 Y-axis position sensor, 49 Y-axis position sensor, 50 Mounting head, 51 Suction nozzle, 52 Z-axis motor, 53 Z-axis position sensor, 55 Mark camera, 58 Part camera, 60 Distance measuring sensor, 61: Irradiation section, 62: Detecting device, 70: Control device, 71 CPU, 72 ROM, 73 HDD, 74 RAM, 75 Input/output interface, 76 Bus, 80 Management device, 81 CPU, 82 ROM, 83 HDD, 84 RAM, 85 Input/output interface, 86 Bus, 87 Input device, 88 Display, A, A1 to A13 Scheduled mounting area, L Land, M, M1 to M9 measurement position, m, m1 to m9 temporary measurement position, P, P1 to P5 Component, S Board.

The invention claimed is:

1. A measurement position determination device to determine one or more measurement positions on a board, comprising:
   a processing circuitry configured to:
      acquire from a storage memory of a management device, coordinates of one or more temporary measurement positions of the board, wherein the measurement positions being for measuring height of the board on which components are to be mounted,
      acquire from the storage memory coordinates of one or more scheduled mounting positions of the components on the board,
      acquire information on an exclusion region of the board to be excluded from the one or more measurement positions, the exclusion region being an area in which a measurement error is likely to occur,
      acquire from multiple position and distance measuring sensors one or more XYZ position coordinates from an upper face of the board, and
      select the one or more measurement positions on the board to determine the height of the board as the coordinates of the scheduled mounting positions outside of the exclusion region and closest to each of the one or more temporary measurement positions.

2. The measurement position determination device of claim 1, wherein the processing circuitry acquires from the storage memory coordinates of a center position of one of the components to be mounted on the board as the scheduled mounting position.

3. The measurement position determination device of claim 1, wherein the processing circuitry acquires multiple temporary measurement positions.

\* \* \* \* \*